United States Patent [19]

Tabei

[11] Patent Number: 4,737,833
[45] Date of Patent: Apr. 12, 1988

[54] SOLID-STATE COLOR IMAGE PICKUP DEVICE WITH ACCUMULATED-LAYER STRUCTURE

[75] Inventor: Masatoshi Tabei, Kaisei, Japan

[73] Assignee: Fuji Photo Film Co., Ltd., Kanagawa, Japan

[21] Appl. No.: 830,887

[22] Filed: Feb. 19, 1986

[30] Foreign Application Priority Data

Feb. 22, 1985 [JP] Japan .................................. 60-32594

[51] Int. Cl.$^4$ ...................... H01L 27/14; H01L 31/00; H04N 9/07; H04N 3/14
[52] U.S. Cl. ......................................... 357/31; 357/30; 357/32; 357/24 LR; 358/43; 358/44; 358/213.11; 358/213.31
[58] Field of Search .................. 357/30 Q, 30 H, 30 I, 357/30 K, 32, 24 LR, 31; 358/43, 44, 213.11, 213.31

[56] References Cited

U.S. PATENT DOCUMENTS

| | | | |
|---|---|---|---|
| 4,404,586 | 9/1983 | Tabei | 358/43 |
| 4,438,455 | 3/1984 | Tabei | 358/43 |
| 4,443,813 | 4/1984 | Tabei | 358/43 |
| 4,472,728 | 9/1984 | Grant et al. | 357/30 Q |

Primary Examiner—Martin H. Edlow
Assistant Examiner—Robert P. Limanek
Attorney, Agent, or Firm—Birch, Stewart, Kolasch & Birch

[57] ABSTRACT

A solid-state image pickup device includes a semiconductor substrate and at least a layer of photosensitive semiconductor having a semiconductor material in which photocarriers are excited with a light incident thereto. The photosensitive semiconductor layer is disposed above one principal surface of the semiconductor substrate and has such a thickness as to allow a portion of the incident light to pass therethrough to the semiconductor substrate. The semiconductor substrate and photosensitive semiconductor layer forms an array of photosensitive areas associated with pixels of a picture. Each of the photosensitive areas includes a connecting element for conducting electric charges from the photosensitive semiconductor layer, a photosensitive region which is formed in the one principal surface of the semiconductor substrate and in which photocarriers are excited with a light incident thereto, a first switching element formed in the one principal surface of the semiconductor substrate and linked to the photosensitive region for producing a signal associated with electric charges in the photosensitive region, a second switching element formed in the one principal surface of the semiconductor substrate and linked to the connecting element for producing a signal associated with electric charges conducted by the connecting element, and an electrode formed on the photosensitive semiconductor layer and being cooperative with the connecting element for establishing an electric field in the photosensitive semiconductor layer substantially in parallel with the principal surface of the photosensitive semiconductor layer.

20 Claims, 8 Drawing Sheets

SOLID-STATE COLOR IMAGE PICKUP DEVICE WITH ACCUMULATED-LAYER STRUCTURE

BACKGROUND OF THE INVENTION

1. Field of the Invention

The present invention relates to a solid-state image pickup device, and in particular, to a solid-state color image pickup device having a photosensitive semiconductor layer sensitive to a light of a specific wavelength range, thereby producing video signals of separated colors.

2. Description of the Prior Art

A solid-state color image pickup device of this type is described in Japanese Patent Laid-Open Publication Nos. 103167/1983, 103165/1983 and 103166/1983.

The Japanese Patent Laid-Open Publication No. 103167/1983 discloses a solid-state color image pickup device comprising a photosensitive semiconductor layer disposed on a primary surface of a semiconductor substrate and being sensitive only to a light having a wavelength not exceeding the wavelengths of blue (B) and a magenta (M) filter configured in a shape of stripes on the photosensitive semiconductor layer so as to form MOS switching gates and photodiodes in the principal surface of the substrate. A photosensitive cell of a pixel is constructed with three MOS switching gates and two photodiodes.

Transparent planar electrodes fixed on the principal surface of the substrate are subjected to a bias voltage to collect photocarrier excited in the layer with an incident light. MOS switching gates are connected to one of the transparent electrode to deliver a blue component of a video signal. A photodiode below the stripe filter supplies a red (R) component of a video signal. This is because the light incident to the photodiode is a red light which has passed through the magenta filter and the photosensitive semiconductor layer. The other photodiode delivers a yellow (Y) component of a video signal. This is because the blue light component of the light incident to this photodiode has been removed by the photosensitive semiconductor layer.

The Japanese Patent Laid-Open Publication No. 103165/1983 describes a solid-state color image pickup device comprising three layers of photosensitive semiconductor in a structure similar to that of the Japanese Patent Laid-Open Publication No. 103167/1983. Among the three semiconductor layers, the layer next to the substrate is sensitive to lights of any wavelengths, the intermediate layer is responsive to a light with a wavelength not exceeding the wavelengths of green, and the further-most layer is sensitive to a light whose wavelength is in the wavelength range of blue or therebelow. The device is not provided with the stripe filter; moreover, the photodiodes are not formed on the primary surface of the substrate. Three MOS switching gates are connected to the associated transparent photosensitive semiconductor electrode layers. This provision enables the R, G and B color video signals to be fed from the respective switching gates.

In the Japanese Patent Laid-Open Publication No. 103166/1983, there is disclosed a solid-state color image pickup device having two photosensitive semiconductor layers. This structure is considered intermediate between the structures of image pickup devices disclosed by the Japanese Patent Laid-Open Publication Nos. 103167/1983 and 103165/1983. In the structure, the semiconductor layer next to the substrate is sensitive to a light with a wavelength not exceeding the green light wavelengths, whereas the other layer is responsive to a light having a wavelength in the blue light wavelength range or therebelow. This device is not provided with the stripe filter but a photodiode is formed for each pixel on the principal surface of the substrate, and two MOS switching gates are connected to the associated transparent photosensitive semiconductor electrode layers. With this configuration, the two switching gates respectively supply the G and B color video signals, whereas the photodiode delivers the R color video signal.

In any devices described above, the bias voltage applied to the two planar transparent electrode layers causes an electric field to be established in the photosensitive semiconductor layer in a direction perpendicular thereto, which leads to the following difficulties in the image pickup device.

For example, if the photosensitive semiconductor contains a pinhole which hinders generation of an electric field, a video signal delivered from the photosensitive cell causes the associated pixel to be displayed as a blank or white dot in a reproduced picture. In addition, a semiconductor material having a resistivity less than about $10^{10}$ Ωcm cannot be utilized for the photosensitive semiconductor layer because of its large dark current, which prevents a desirable low noise level from being developed. Consequently, the freedom of selection of semiconductor materials is limited. Furthermore, the electrode layer below the photosensitive semiconductor layer has also to be transparent, that is, a transparent electrode material such as ITO is necessarily be used, which limits the freedom of selection of electrode materials. Moreover, the multilayer structure of these devices necessitates a great number of processes and complicated processing in manufacturing.

SUMMARY OF THE INVENTION

It is therefore an object of the present invention to provide a solid-state color image pickup device having a relatively simple structure, thereby removing the disadvantages of the prior art technique.

In accordance with the present invention, there is provided a solid-state color image pickup device comprising a semiconductor substrate and at least a photosensitive semiconductor layer including a semiconductor material in which photocarriers are excited with a light incident thereto, said photosensitive semiconductor layer being disposed above one principal surface of said semiconductor substrate and having such a thickness as to allow a portion of said incident light to pass therethrough to said semiconductor substrate, said semiconductor substrate and said photosensitive semiconductor layer forming an array of photosensitive areas associated with pixels of a picture, each of said photosensitive areas comprising connecting means for conducting electric charges from said photosensitive semiconductor layer, a photosensitive region which is formed in said one primary surface of said semiconductor substrate and in which photocarriers are excited with a light incident thereto, first switching means formed in said one primary surface of said semiconductor substrate and connected to said photosensitive region for producing a signal associated with the electric charges in said photosensitive region, second switching means formed in said one primary surface of said semiconductor substrate and linked to said connecting means for producing a signal associated with the electric charges conducted by said connecting means, and electrode means formed on said photosensitive semiconductor layer and being cooperative with said connecting means for establishing an electric field in said photosensitive semiconductor layer substantially in parallel with the primary surface of said photosensitive semiconductor layer.

Also in accordance with the present invention, there is provided a solid-state color image pickup device comprising a semiconductor substrate and at least two layers of photosensitive semiconductor including a semiconductor material in which photocarriers are excited with a light incident thereto, said photosensitive semiconductor layers being formed above one primary surface of said semiconductor substrate, said semiconductor substrate and said photosensitive semiconductor layers forming an array of photosensitive areas associated with pixels of a picture, each of said photosensitive areas including at least two connecting means each for conducting electric charges from respective one of said photosensitive semiconductor layers, at least two switching means each formed in said one primary surface of said semiconductor substrate and linked to respective one of said two connecting means for producing a signal associated with the electric charges conducted by respective one of said connecting means, and at least two electrode means each formed on respective one of said photosensitive semiconductor layers and being cooperative with respective one of said connecting means for establishing an electric field in respective one of said photosensitive semiconductor layers substantially in parallel with the primary surfaces of said photosensitive semiconductor layers.

BRIEF DESCRIPTION OF THE DRAWINGS

The objects and features of the present invention will become more apparent from the consideration of the following detailed description taken in conjunction with the accompanying drawings in which.

DESCRIPTION OF THE PREFERRED EMBODIMENTS

Referring now to the accompanying drawings, embodiments of the solid-state color image pickup device according to the present invention will be described in detail.

Figure 1:
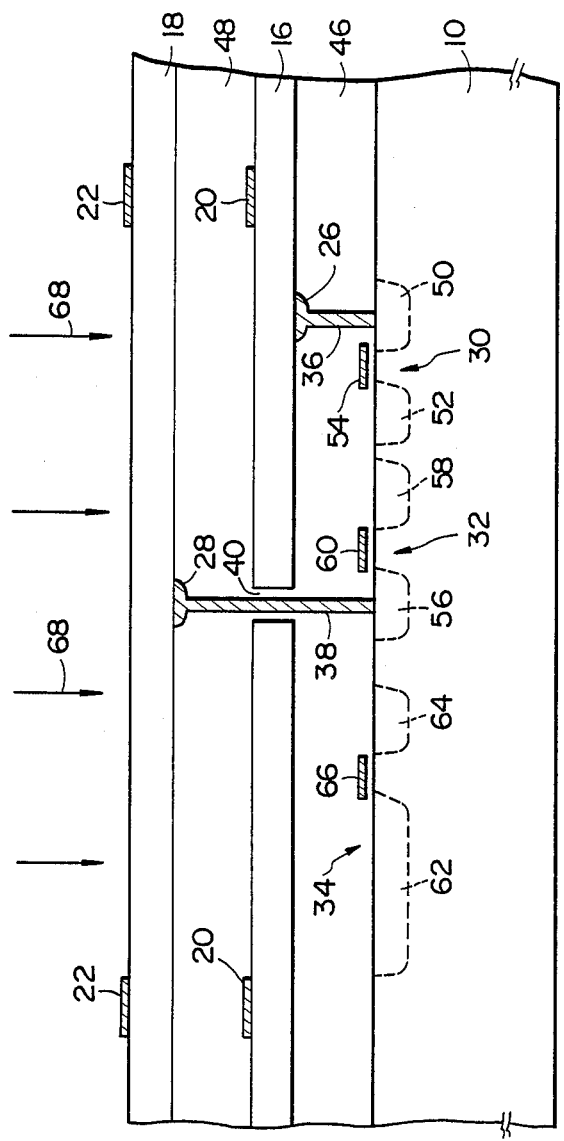
FIG. 1 is a schematic cross-sectional view including two cross sections of embodiments of FIGS. 2-3 and FIGS. 4-5 according to the present invention.
Figure 2:
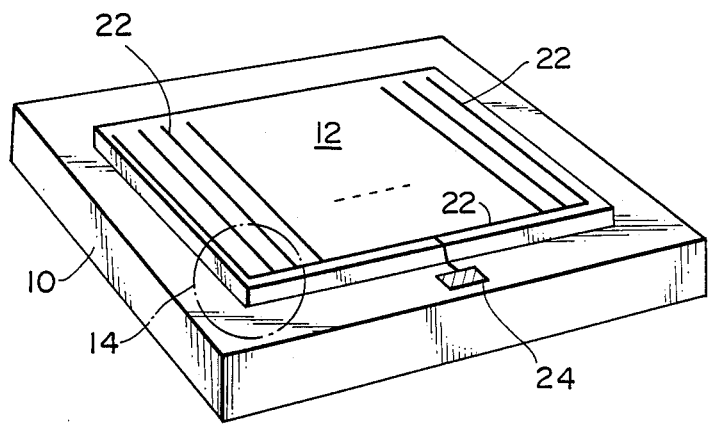
FIG. 2 is a conceptual perspective view of an embodiment of the solid-state color image pickup device according to the present invention.

In FIG. 2, showing an embodiment of the present invention, a photosensitive cell array 12 includes a plurality of photosensitive cells arranged in an array on a planar substrate 10, thereby configuring a solid-state color image pickup device. In this embodiment, a p-type silicon is advantageously used for the substrate 10. As can be seen from a perspective view of FIG. 3, conceptually depicting a portion enclosed with a dotted line circle 14 of FIG. 2, two photosensitive semiconductor layers 16 and 18 are formed in this order on a primary surface of the substrate 10. Between the substrate 10 and the semiconductor layer 16, and between the semiconductor layers 16 and 18, insulation layers 46 and 48, FIG. 1, are respectively disposed to electrically separate these components from each other.

In this embodiment, the semiconductor layer 16 includes a semiconductor material sensitive to a light with a wavelength of green (G) or below for generating photocarriers, whereas the semiconductor layer 18 contains a semiconductor substance sensitive to a light having a wavelength of blue (B). Consequently, the semiconductor layer 18 generates photocarriers associated with the B component of the incident light, and the semiconductor layer 16 therebelow generates photocarriers associated with a G component of the incident light from which the B component has been removed. Therefore, the rest of incident light, namely, a light having a wavelength in the wavelength range of red (R) can reach the substrate 10. On predetermined one of primary surfaces of the semiconductor layers 16 and 18, there are fixed electrode conductors 20 and 22, respectively, which may have a shape of a comb, stripes, or a band. The conductors 20 and 22 are formed in association with photosensitive cells in a column direction of the array, for example. Metals, such as aluminum and aluminum-silicon alloy, may advantageously be utilized for these electrode conductors. They may naturally be formed by use of a transparent electrode material, for example ITO. In this embodiment, the conductors 20 are electrically connected to each other. This is also the case with the conductors 22. As can be seen from FIG. 2, the electrode conductor 22 is connected to a contact pad 24, which in turn is connected to an external circuit such as a bias circuit. Although the conductors 20 and 22 are electrically separated in this embodiment, they may be commonly connected to each other.

On the other primary surfaces of the semiconductor layers 20 and 22, isolated electrode conductors 26 and 28 are disposed in association with photosensitive cells which are as a whole configured in a mosaic arrangement. A metal, such as aluminum, is advantageously used also for these conductors.

In a layer epitaxially grown on a primary surface of the substrate 10, switching elements 30 and 32 and a photodiode 34 are formed in association with a photosensitive cell. Although the switching elements 30 and 32 each are of the MOS structure, other structures, such as MNOS and CCD, may also be advantageously used. The switching elements 30 and 32 are connected by electric connections 36 and 38, respectively to the conductor 26 of the semiconductor layer 16 and the conductor 28 of the semiconductor layer 18, respectively. The electric connection 38 is linked through an opening 40 of the semiconductor layer 16 to the conductor 28 so as to be electrically separated from the semiconductor layer 16.

Consequently, the switching elements 30 and 32 each achieve a switching function for the G and B components of video signal; furthermore, the photodiode 34 is sensitive to the R component of the incident light, thereby generating an associated video signal. A set of the switching elements 30 and 32 and the photodiode 34 is thus associated with a pixel in reproducing a picture.

Figure 3:
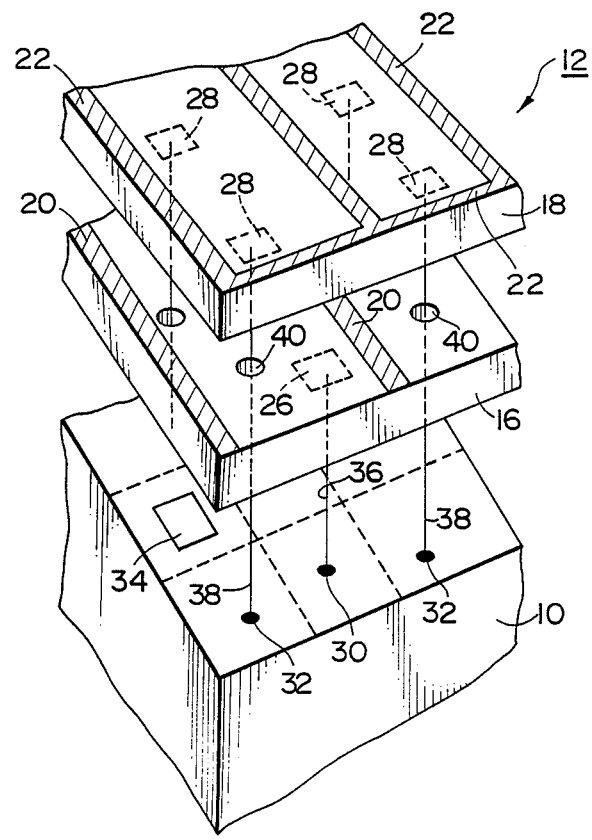
FIG. 3 is an exploded perspective view showing a portion of the device of FIG. 2 enclosed with a dotted line in FIG. 2.
Figure 4:
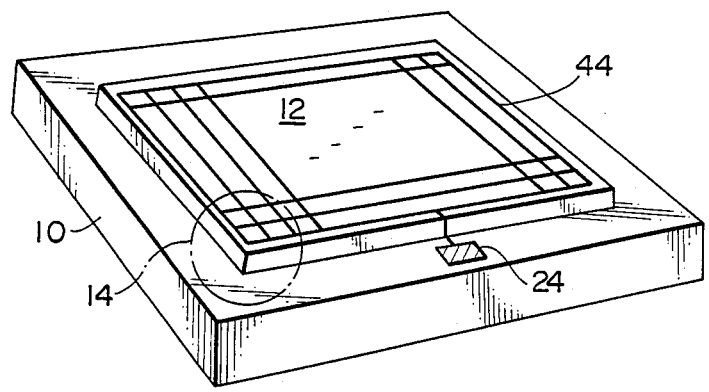
FIGS. 4 and 5 are schematic perspective views, similar to FIGS. 2 and 3, respectively, showing an alternative embodiment.
Figure 5:
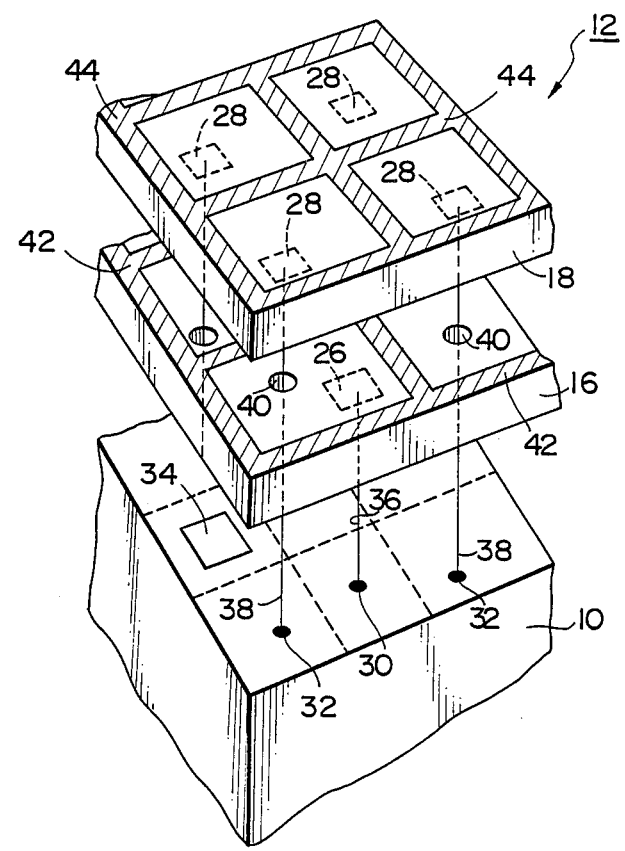

FIGS. 4 and 5 are conceptual views illustrating an alternative embodiment of the present invention which is different from that depicted in FIGS. 2 and 3 in that electrodes 42 and 44 having a shape of a grid are disposed in place of the comb-shaped electrodes 20 and 22 on one of primary surfaces of the semiconductor layers 16 and 18, respectively. A cellular region of the grid-shaped electrodes 42 and 43 includes three photosensitive cells, which forms a pixel of a reproduced picture. In the following figures, the similar components will be indicated with the same reference numerals to avoid duplicated description.

Referring FIG. 1, the embodiments of the present invention will be further described in detail. FIG. 1 is a conceptual view depicting two cross-sections of the devices of the embodiments shown in FIGS. 2-3 and 4-5 for facilitating the understanding of the present invention.

As can be seen from FIG. 1, the switching elements 30-32 each are configured in the MOS transistor structure. The transistor 30 comprises two n-type diffusion regions 50 and 52 each independently disposed in a surface of the substrate 10 with a gate electrode 54 formed in an insulation layer 46 therebetween. The gate electrode 54 may be constituted with polycrystalline silicon or a metal. The region 50 thus forms a source linked to the electric connection 36. The diffusion region 52 forming a drain is linked to the associated regions 52 of the other photosensitive cells in a direction perpendicular to the plane including the figure, thereby functioning as a signal readout or sensing line in the column direction of the array 12. The gate electrode 54 is interconnected to an associated register stage of a shift register, not shown, to be selectively energized for associated photosensitive cells in the column direction. Consequently, when appropriately biased, the diffusion region 52 is supplied with the G component of a video signal.

Similarly, the transistor 32 includes two n-type diffusion regions 56 and 58 with a gate electrode 60 formed in the insulation layer 46 therebetween. Polycrystalline silicon or a metal may be used for the gate electrode 60. The region 56 thus forms a source coupled to the electric connection 36. The diffusion region 58 constituting a drain is connected to the associated regions 58 of the other photosensitive cells in a direction perpendicular to the plane of the figure, thereby serving as a signal readout line in the column direction of the array 12. The gate electrode 60 is connected to an associated register stage of the shift register, not shown, to be selectively energized for the associated cells in the column direction. As a consequent, when appropriately biased, the B component of video signal is supplied to the region 58.

The photodiode 34 includes an n-type diffusion region 62 formed as a photosensitive area in the principal surface of the substrate 10 and an n-type diffusion region 64 disposed at a location opposing the diffusion region 62. A gate electrode 66 is formed in the insulation layer 46 between the diffusion regions 62-64. The electrode may be constructed with polycrystalline silicon or a metal. Since the silicon substrate 10 has a relatively higher sensitivity to a light having a longer wavelength, namely, the conversion quantum efficiency is almost unity, the optical opening ratio, that is, the ratio of the photosensitive area 62 to the light receiving area of three photosensitive cells between two comb-shaped electrodes 22 may be low.

As can be clear from this structure, the regions 62-64 and the gate electrode 66 constitute an MOS transistor with the regions 62-64 being a source and a drain, respectively; moreover, the region 64 is connected to the associated regions 64 of the other photosensitive cells in a direction perpendicular to the plane of the figure, thereby configuring a signal readout line in the column direction of the array 12. The gate electrode 66 is connected to an associated register stage of a shift register, not shown, so as to be selectively energized for the photosensitive cells in the column direction. Consequently, when appropriately biased, the diffusion region 64 supplies the R component of a video signal generated by a light associated with the R component signal and received by the photosensitive area 62.

It can be understood therefore that when shift registers energizing the gates 54, 60 and 66 are driven to sequentially energize these gates, the transfer path regions 52, 58 and 64 are supplied with the B, G and R color video signals, respectively.

Although the electrodes 26 and 28 are connected to the source regions 50 and 65 of the switching elements 30 and 32, respectively in this embodiment, the configuration is not limited to this example. For example, these electrodes 26 and 28 may be connected to the gate electrodes 54 and 56, respectively. This is also the case with the other embodiments.

During the operation of the device, bias voltages are applied between the electrodes 20 and 26, and also the electrodes 22 and 28. The polarities of the bias voltages are determined so that photocarriers generated in the photosensitive semiconductor layers 16 and 18 are drawn toward the electrodes 26 and 28, respectively, in this embodiment. That is, the semiconductor layers 16 and 18 are subjected to an electric field in a direction substantially parallel to the principal surfaces thereof; consequently, the electric charges generated therein are fed in a direction substantially parallel to the principal surfaces.

When the semiconductor layer 18 is irradiated with light 68, the B component having a relatively shorter wavelength is absorbed in the layer 18, which in turn causes photocarriers to be excited dependently upon the intensity of the B component. The excited photocarriers are delivered toward the electrode 28 due to the electric field generated in the semiconductor layer 18 between the electrodes 28 and 22 in a direction substantially parallel to the principal surface of the layer 18. These photocarriers are fed via the switching element 32 to the readout line region 58.

The rest of the incident light 68 that passed the semiconductor layer 18, namely, the light associated with the wavelength of G and R components enters the semiconductor layer 16, which absorbs the G component having a relatively intermediate wavelength and causes photocarriers to be excited therein according to the intensity of the G component. The photocarriers are delivered toward the electrode 26 due to an electric field generated between the electrodes 26 and 20 in a direction substantially parallel to the primary surface of the layer 18 so as to be fed via the switching element 30 to the transfer path 52.

The component of the incident light that passed the semiconductor layer 16, namely, the R component having a relatively longer wavelength reaches the photosensitive region 62 in which photocarriers are excited dependent upon the intensity of the G component in the boundary portion between the region 62 and the substrate 10, namely, the junction portion. The photocarriers are delivered to the readout line region 64 under the control of the gate 66. The readout line regions 52, 58 and 64 are therefore supplied with the B, G and R components, respectively, of a video signal which have been substantially separated from each other.

In this embodiment as described above, since the electric fields are generated in the photosensitive semiconductor layers 16 and 18 in a direction substantially parallel to the primary surfaces of the layers, they have a sufficient strength even if these layers 16 and 18 contain pinholes, which does not cause such a defect of a white or blank dot in a reproduced picture as described before. In addition, the limitation of semiconductor materials suitable for the layers 16 and 18 is extensively relaxed. Moreover, transparent electrode materials may not be necessarily used for the isolated island-shaped electrodes 26 and 28, which may furthermore be formed as portions of the electric connections 36 and 38, respectively. As a result, the manufacturing process of the transparent electrodes and the lithography process are simplified.

Figure 6:
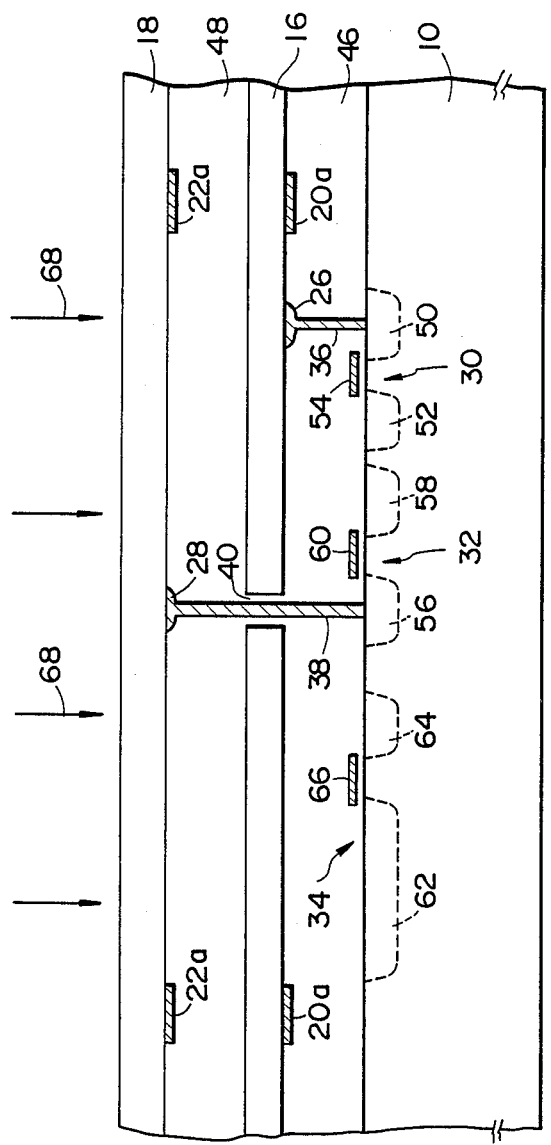
FIG. 6 is a schematic cross-sectional view, similar to FIG. 1, illustrating another alternative embodiment of the present invention.

FIG. 6 is a schematic cross-sectional view of another alternative embodiment of the present invention which is different from that shown in FIG. 1 in that the electrodes 20 and 22 disposed on one of the principal surfaces of the semiconductor layers 16 and 18 in FIG. 1 are replaced with the electrodes 20a and 22a formed on the other of the principal surfaces. These electrodes are advantageously of a shape of a comb, stripes, or a grid. The other features may be the same as those of the embodiment of FIG. 1. Also with this structure, electric fields are generated in the semiconductor layers 16 and 18 in a direction substantially parallel to the principal surfaces of these layers.

In the embodiment of FIG. 1, since the electrode layers 20 and 22 are respectively disposed opposite to the electrodes 26 and 28 with respect to the semiconductor layers 16 and 18, it is required to manufacture the former in the different processes from the latter. In the embodiment of FIG. 6, however, they are all disposed in the same direction with respect to the semiconductor layers 16 and 18, so that it is possible to fabricate them in common processes.

Figure 7:
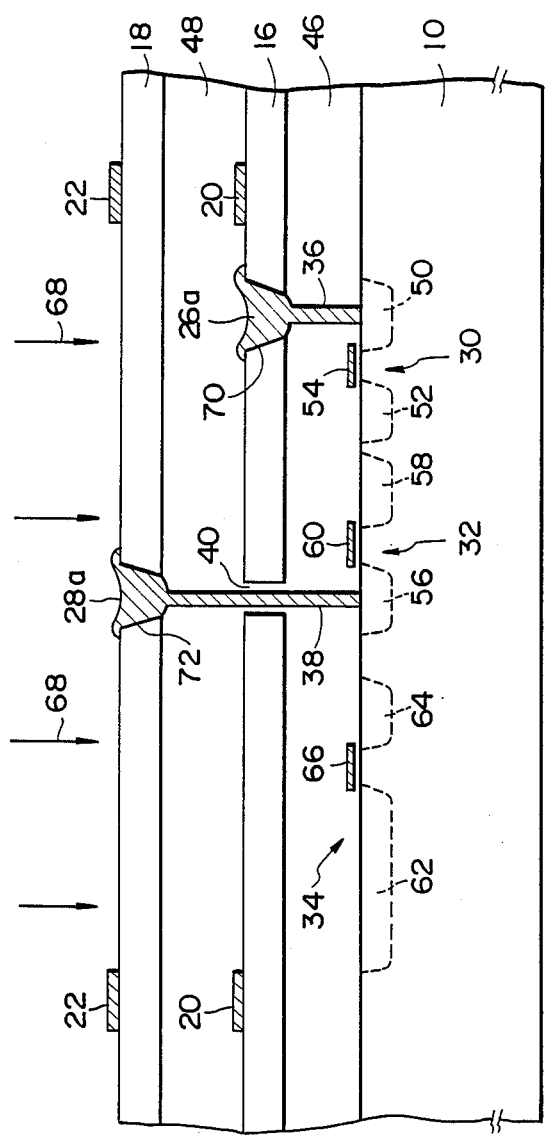
FIGS. 7-10 are cross-sectional views, similar to FIG. 1, depicting other alternative embodiments of the present invention.

FIG. 7 is a cross-sectional view of another alternative embodiment of the present invention which is different from that of FIG. 1 in that the electrodes 26 and 28 of FIG. 1 are replaced with the electrodes 26a and 28a formed in holes 70 and 72, respectively disposed in the semiconductor layers 16 and 18. The other components may be the same as those of the embodiment of FIG. 1. Also with this configuration, electric fields are generated in the semiconductor layers 16 and 18 in a direction substantially parallel to the primary surfaces thereof.

The present invention is not limited to the embodiments shown in the accompanying drawings but it can be advantageously applied, for example, to a device in which the 2- or 3-electrode structure, or a combination of such electrode arrangements is adopted.

Figure 8:
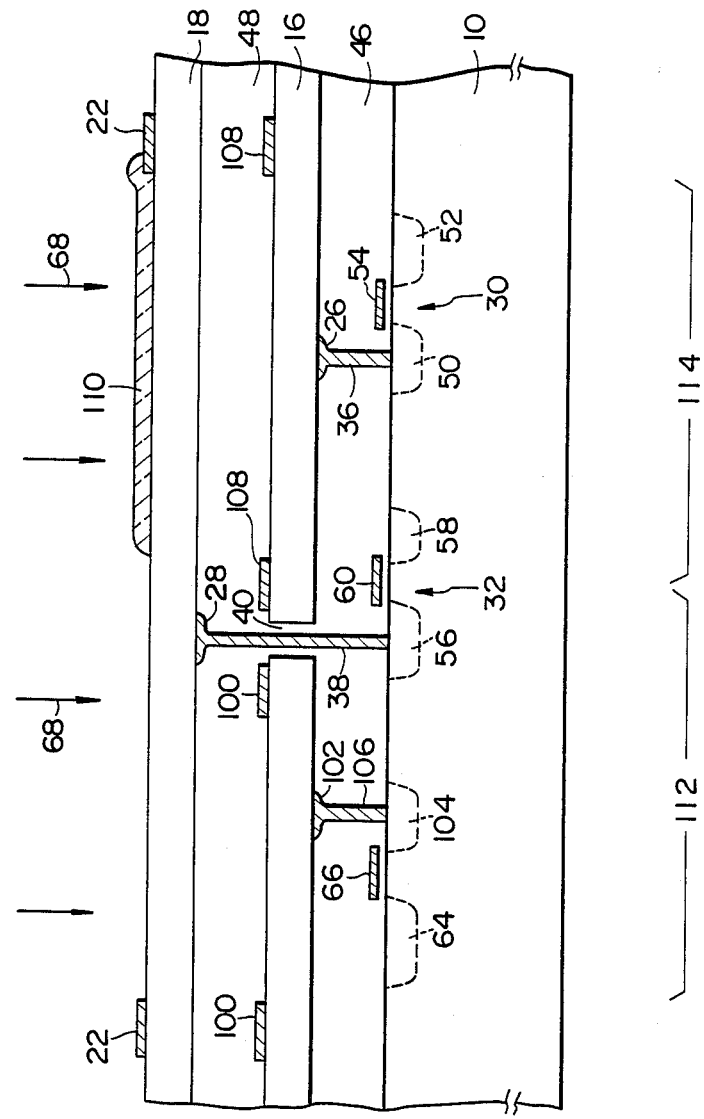

FIG. 8 is a schematic diagram depicting a cross-sectional view of still another alternative embodiment of the present invention. In the preceding embodiments, the photodiode 34 is formed in the primary surface of the substrate, whereas this embodiment does not include an element equivalent to the photodiode 34 with the area of the photosensitive semiconductor layer associated with a pixel being split into two sections. In a region 112 on the semiconductor layer 16, an electric conductor 100 having a form of a comb, stripes, or a grid is disposed on a primary surface of the layer 16. On the other primary surface of the semiconductor layer 16, an electrode conductor 102 is disposed in a shape of isolated islands or a mosaic. At a position of the primary surface of the substrate 16 associated with the electrode conductor 102, an n-type diffusion area 104 is formed to be linked to the electrode conductor 102 through an electric connection 106. The region 104 is opposed to the readout line region 64 via the gate electrode 66 placed therebetween.

Similarly, in the other region 114 of the semiconductor layer 16, a comb-, stripe- or grid-shaped electric conductor 108 is fixed on a primary surface of the layer 16. On the other primary surface thereof, the electric conductor 26 is formed in a shape of isolated islands or a mosaic. The electric conductor 26 is linked via an electric connection 36 to the region 50 on the primary surface of the substrate 10. In this embodiment, a layer of optical filter 110 is disposed over the area 114 of the semiconductor layer 16 so as to cover a portion of the primary surface of the photosensitive semiconductor 18 in the region 114, that is, the filter 110 extends in a direction perpendicular to the plane of FIG. 8. The filter 110 is formed in stripes to cover the regions 114 of other pixels contained in the same column, for example. It is a cyan filter in this example, however, the other color, such as magenta, is also available.

In operation, the semiconductor layer 18 is sensitive to the B component of the incident light 68 to generate photocarriers accordingly. Since the cyan filter allows the B component to pass therethrough, the photocarriers associated with the B component will be generated in the entire range of the regions 112 and 114. These photocarriers are delivered toward the electrode 28 because of an electric field generated between the electrodes 22 and 28 so as to be sensed in the form of a video signal through the switching element 32.

The light that has passed through the semiconductor layer 18 in the area 112 includes the G and R components, which in turn excite the associated photocarriers in the semiconductor layer 16. The photocarriers are drawn toward the electrode 102 due to an electric field generated between the electrodes 100 and 102. When the gate 66 is energized, they are read out in the form of the G plus R components of a video signal over the readout line 64.

Since the light passing through the semiconductor layer 18 in the area 114 has passed the cyan filter, it contains the G component, which then excites the associated photocarriers in the semiconductor layer 16. The photocarriers are fed to the electrode 26 because of an electric field generated between the electrode 108 and 26 to be transferred in the form of the G component of a video signal through the switching element 30 to the readout line 52. If a magenta filter is adopted in place of the cyan filter 110, the region 114 supplies the R component of a video signal.

Figure 9:
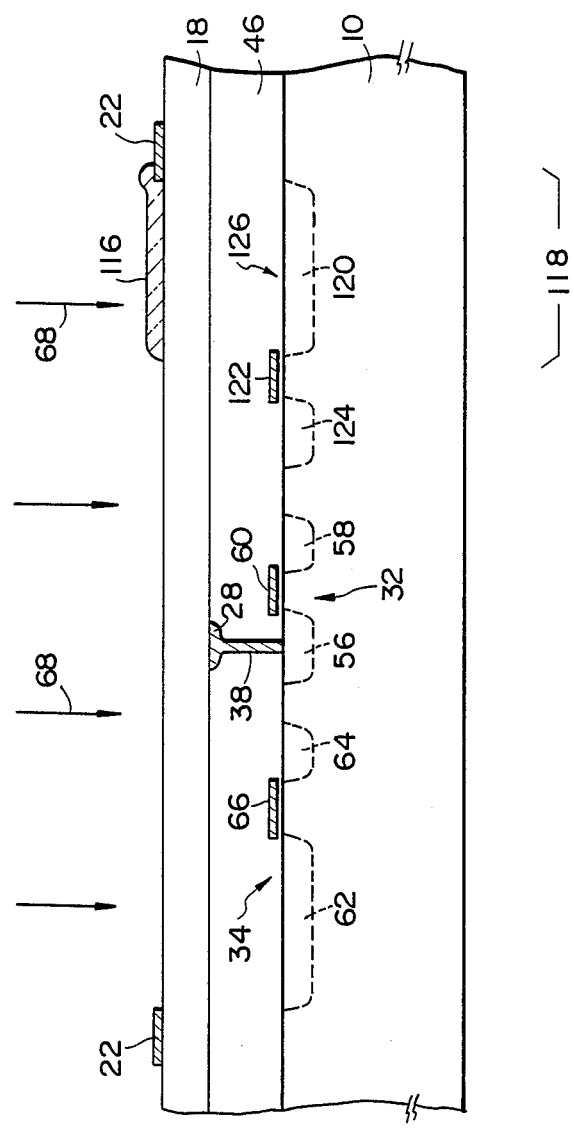

FIG. 9 is a cross-sectional diagram of further alternative embodiment of the present invention which includes a single photosensitive semiconductor layer. The embodiment comprises the photosensitive semiconductor layer 18 and the insulation layer 46, and neither the photosensitive semiconductor layer 16 nor the insulation layer 40 disposed in the foregoing embodiments. In a portion of the primary surface of the semiconductor layer 18 associated with an area 118, a filter 116 is formed. This filter may be similar to the filter 110 described with reference to FIG. 8.

An n-type diffusion region 120 is formed on the primary surface of the substrate 10 associated with the area 118. Like the photosensitive area 62, the region 120 forms a photodiode 126 with the p-type substrate 10. In the substrate 10, an n-type diffusion region 124 is disposed at a position opposing the region 120 across a gate electrode 122 formed in the insulation layer 42 by use of a metal or polycrystalline silicon. This structure configures a switching element, where the area 120 is a source and the region 124 forms a drain which is linked to the associated regions 124 of the other photosensitive cells in a direction perpendicular to the plane of FIG. 9 so as to function as a signal readout line in the column direction of the array 12.

In operating, the semiconductor layer 18 is sensitive to the B component of the incident light 68 to generate photocarriers. Since the cyan filter 116 allows the B component to pass therethrough, the photocarriers associated with the B component can be generated in the entire area disposed for a pixel. These photocarriers are fed toward the electrode 28 due to an electric field formed between the electrodes 22 and 28 to be read out in the form of a video signal through the switching element 32.

Since the light passing the semiconductor layer 18 in the area 118 has passed the cyan filter 116, it includes the G component, which excites the associated photocarriers in the photosensitive area 120. When the gate electrode 122 is energized, the photocarriers are read out in the form of the G component of a video signal on the readout line 124.

The light passing through a portion of the semiconductor layer 18 other than the area 118 contains the G and R components, which then excite the associated photocarriers in the photosensitive area 62. When the gate electrode 66 is energized, these photocarriers are sensed in the form of the G plus R components of a video signal from the readout line 64.

In this embodiment, the opening ratio of a B cell is about three times as much as that for the other colors; furthermore, the opening ratios of G and G+R cells are greater than those of the prior art device because the B cells are not disposed in the substrate. If a magenta filter is used in place of the cyan filter 116, the area 120 supplies the R component of a video signal. This embodiment comprises a single photosensitive semiconductor layer and is hence characterized by simple manufacturing processes.

Figure 10:
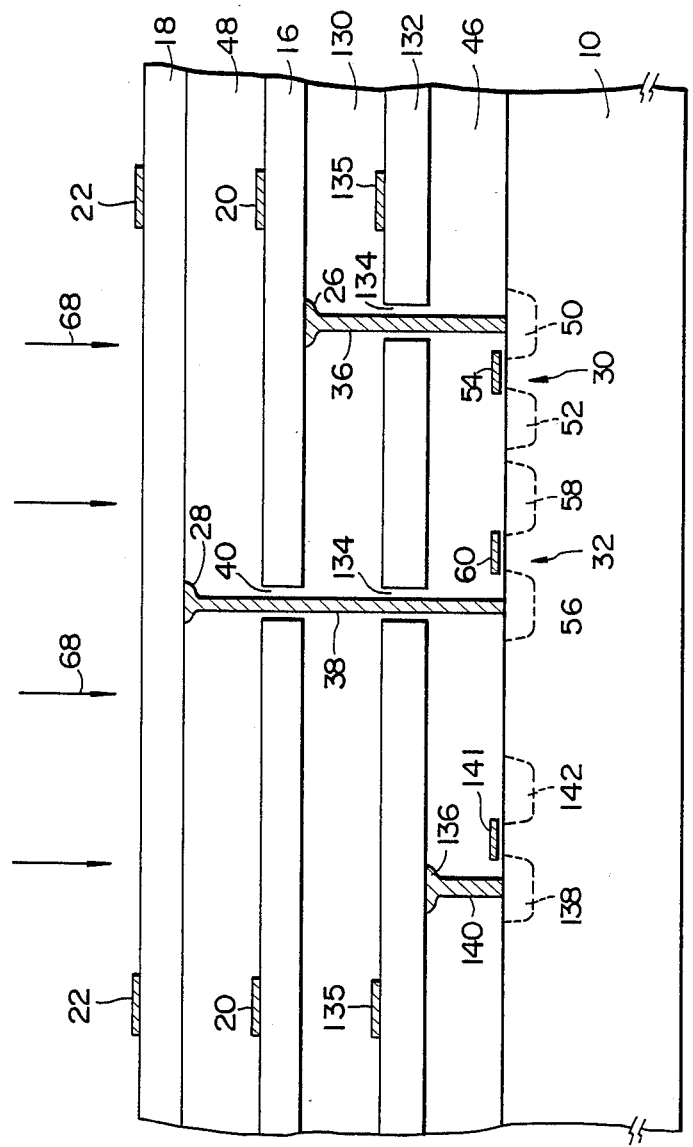

Referring now FIG. 10, there is shown another embodiment of the present invention in which three photosensitive semiconductors are disposed. In this embodiment, an insulation layer 130 and a photosensitive semiconductor layer 132 are formed between the semiconductor layer 16 and the insulation layer 46 as in the embodiment described with reference to FIG. 1. In the instant embodiment, the semiconductor layer 132 includes a semiconductor material which is sensitive to a light with a wavelength not exceeding the wavelengths of red. The layer 132 is provided with holes 134 for passing the electric connections 36 and 38 therethrough.

A comb-, stripe-, or grid-shaped electric conductor 135 is fixed on a primary surface of the semiconductor layer 132, whereas an electric conductor 136 is formed in a shape of isolated islands or a mosaic on the other primary surface of the layer 132. An n-type diffusion region 138 disposed at a position on the primary surface of the substrate associated with the electric conductor 136 is linked by an electric connection 140 to the electric conductor 136. An n-type diffusion region 142 is formed also on the primary surface of the substrate 10. The insulation layer 46 is provided with a gate electrode 141 formed of polycrystalline silicon or a metal in the neighborhood of the primary surface of the substrate 10 in such a manner that the region 138 is at a location opposing a readout line area 142 with the gate electrode 141 located therebetween.

When the device is irradiated with the incident light 68, the B component having a relatively shorter wavelength causes photocarriers to be excited in the semiconductor layer 18. These photocarriers are drawn toward the electrode 28 due to an electric field generated between the electrodes 28 and 22 to be supplied via the switching element 32 to the readout line area 58.

Among the component of the incident light 68 that has passed through the semiconductor layer 18, namely, the light having wavelength of the G and R components, the G component with a relatively intermediate wavelength causes photocarriers to be excited in the semiconductor layer 16 according to the intensity of the G component. The photocarriers are fed toward the electrode 26 because of an electric field formed between the electrodes 26 and 20 so as to be delivered to the readout line region 52 through the switching element 30.

The component of the incident light 68 that has passed through the semiconductor layer 16, namely, the R component with a relatively longer wavelength reaches the photosensitive semiconductor layer 132, which then causes photocarriers to be excited according to the strength of the R component. The photocarriers are fed toward the electrode 136 under the influence of an electric field generated between the electrodes 135 and 136 in a direction substantially parallel to the primary surface of the layer 132. When the gate 141 is energized, these photocarriers are delivered to the readout line region 142. The readout line regions 52, 58 and 142 are thus supplied with the substantially separated color signals, namely, B, G and R components of a video signal.

When compared with the conventional device comprising a monolithic photosensitive cells for the B, G and R components formed on the substrate 10, the optical opening ratio of this embodiment is about three times as much for each color. As a consequence, the overall sensitivity is expected to be about nine times as much as that of the prior art device.

In accordance with the present invention, therefore, since the electric field is generated in the photosensitive semiconductor in a direction substantially parallel to the principal surface thereof, the electric field becomes sufficient even if the photosensitive semiconductor contains pinholes, and hence the defect of a white or blank spot is not caused in a reproduce image. In addition, the limitation imposed on selection of semiconductor materials suitable for the photosensitive semiconductor layers due to the specific resistance is relaxed. Moreover, a transparent electrode material may not be necessarily utilized for the mosaic-shaped electrode; consequently, the manufacturing and lithography processes for the transparent electrode can be simplified. Furthermore, the solidstate color image pickup device according to the present invention has a relatively simpler structure.

While the present invention has been described with reference to the particular illustrative embodiments, it is not restricted by those embodiments but only by the appended claims. It is to be appreciated that those skilled in the art can change or modify the embodiments without departing from the scope and spirit of the present invention.

What is claimed is:

1. A solid-state color image pickup device comprising:
   a semiconductor substrate; and
   at least a layer of photosensitive semiconductor including a semiconductor material in which photoelectric charges are excited with a light incident thereto;
   said photosensitive semiconductor layer being disposed above one principal surface of said semiconductor substrate and having such a thickness as to allow a portion of said incident light to pass therethrough to said semiconductor substrate;
   said semiconductor substrate and said photosensitive semiconductor layer forming an array of photosensitive areas associated with pixels of a picture;
   each of said photosensitive areas comprising:
   connecting means for conducting electric charges from said photosensitive semiconductor layer;
   a photosensitive region which is formed in said one principal surface of said semiconductor substrate and in which photoelectric charges are excited with a light incident thereto;
   first switching means formed in said one principal surface of said semiconductor substrate and interconnected to said photosensitive region for producing a signal associated with the electric charges in said photosensitive region;
   second switching means formed in said one principal surface of said semiconductor substrate and interconnected to said connecting means for producing a signal associated with the electric charges conducted by said connecting means; and
   electrode means formed on said photosensitive semiconductor layer and being cooperative with said connecting means for establishing an electric field in said photosensitive semiconductor layer substantially in parallel with the principal surface of said photosensitive semiconductor layer.

2. A device according to claim 1 wherein,
   two layers of said photosensitive semiconductor are provided,
   said connecting means, said second switching means, and said electrode means being disposed in associated with said two photosensitive semiconductor layers.

3. A device according to claim 1 wherein,
   said photosensitive semiconductor layer is single,
   each of said photosensitive areas including two of said photosensitive regions,
   optical filter means being disposed above one of said two photosensitive regions for removing a portion of components of a light that passes through said photosensitive semiconductor layer.

4. A device according to claim 1 wherein said photosensitive areas are arranged in an array.

5. A device according to claim 1 wherein,
   said connecting means is interconnected to said photosensitive semiconductor layer on a principal surface thereof which faces said semiconductor substrate,
   said electrode means being disposed on the other principal surface of said photosensitive semiconductor layer.

6. A device according to claim 1 wherein,
   said connecting means is interconnected to said photosensitive semiconductor layer on a principal surface thereof which faces said semiconductor substrate,
   said electrode means being disposed on a principal surface of said photosensitive semiconductor layer, which principal surface faces said semiconductor substrate.

7. A device according to claim 1 wherein said connecting means is interconnected to said semiconductor substrate through a hole formed in said photosensitive semiconductor layer.

8. A device according to claim 5 wherein said connecting means includes an electrode conductor formed in a shape of isolated islands.

9. A device according to claim 5 wherein said electrode means comprises an electrode conductor formed in a shape of a band.

10. A device according to claim 9 wherein said band-shaped electrode conductor includes a metal material.

11. A solid-state color image pickup device comprising:
    a semiconductor substrate; and
    at least two layers of photosensitive semiconductor including a semiconductor material in which photoelectric charges are excited with a light incident thereto;
    said photosensitive semiconductor layers being disposed above one principal surface of said semiconductor substrate;
    said semiconductor substrate and said photosensitive semiconductor layers forming an array of photosensitive areas associated with pixels of a picture;
    each of said photosensitive areas comprising:
    at least two connecting means each for conducting electric charges from respective one of said photosensitive semiconductor layer;
    at least two switching means each formed in said one principal surface of said semiconductor substrate and interconnected to respective one of said connecting means for producing a signal associated with the electric charges conducted by respective one of said connecting means; and
    at least two electrode means each formed on respective one of said photosensitive semiconductor layers and being cooperative with respective one of said connecting means for establishing an electric field in respective one of said photosensitive semiconductor layers in a direction substantially parallel to the principal surfaces of said photosensitive semiconductor layers.

12. A device according to claim 11 wherein,
    three layers of said photosensitive semiconductor are provided,
    said connecting means, said switching means, and said electrode means being disposed in association with respective one of said three photosensitive semiconductor layers.

13. A device according to claim 11 wherein,
    two layers of said photosensitive semiconductor are provided,
    each of said photosensitive areas including:

a set of said connecting means, said switching means, and said electrode means for one of said photosensitive semiconductor layers;

a set of said connecting means, said switching means, and said electrode means disposed for one portion of the other of said photosensitive semiconductor layers;

a set of said connecting means, said switching means, and said electrode means disposed for the remaining portion of said other photosensitive semiconductor layer; and optical filter means disposed above said one portion for removing a portion of components of a light that pass through said photosensitive semiconductor layers.

14. A device according to claim 11 wherein said photosensitive areas are arranged in an array.

15. A device according to claim 11 wherein, each of said connecting means is interconnected to respective one of said photosensitive semiconductor layers on a respective principal surface thereof facing said semiconductor substrate, each of said electrode means being arranged on the other principal surface of respective one of said photosensitive semiconductor layers.

16. A device according to claim 11 wherein, each of said connecting means is interconnected to respective one of said photosensitive semiconductor layers on a principal surface thereof facing said semiconductor substrate, each of said electrode means being disposed on a principal surface of respective one of said photosensitive semiconductor layers, which principal surface faces said semiconductor substrate.

17. A device according to claim 11 wherein said connecting means is interconnected to said semiconductor substrate through a hole formed in said photosensitive semiconductor layer.

18. A device according to claim 15 wherein said connecting means includes an electric conductor formed in a shape of isolated islands.

19. A device according to claim 15 wherein said electrode means includes an electrode conductor formed in a shape of a band.

20. A device according to claim 19 wherein said band-shaped electrode conductor includes a metal material.

* * * * *